(12) United States Patent
Aizawa

(10) Patent No.: US 6,225,227 B1
(45) Date of Patent: *May 1, 2001

(54) METHOD FOR MANUFACTURING SEMICONDUCTOR DEVICE

(75) Inventor: Kazuo Aizawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/061,327

(22) Filed: Apr. 17, 1998

(30) Foreign Application Priority Data

Apr. 17, 1997 (JP) .................................. 9-100353

(51) Int. Cl.$^7$ .................................................. H01L 21/302
(52) U.S. Cl. ........................... 438/694; 438/698; 438/700; 438/702
(58) Field of Search ..................................... 438/720, 694, 438/698, 719, 642, 632, 700, 702, 706

(56) References Cited

U.S. PATENT DOCUMENTS

| | | | | |
|---|---|---|---|---|
| 5,217,834 | * | 6/1993 | Higaki | 430/30 |
| 5,266,521 | * | 11/1993 | Lee et al. | 438/642 |
| 5,288,664 | * | 2/1994 | Mukai | 438/632 |
| 5,379,348 | * | 1/1995 | Watanabe et al. | 382/144 |
| 5,405,810 | * | 4/1995 | Mizuno et al. | 438/16 |
| 5,422,498 | * | 6/1995 | Nikawa et al. | 257/48 |
| 5,504,017 | * | 4/1996 | Yue et al. | 374/5 |
| 5,545,570 | * | 8/1996 | Chung et al. | 438/703 |

FOREIGN PATENT DOCUMENTS

| | | |
|---|---|---|
| 6-69307 | 3/1994 | (JP) . |
| 7-297277 | 11/1995 | (JP) . |

* cited by examiner

Primary Examiner—Robert Kunemund
Assistant Examiner—Binh X Tran
(74) Attorney, Agent, or Firm—Sughrue, Mion, Zinn, Macpeak & Seas, PLLC (57) ABSTRACT

In a method for manufacturing a semiconductor device in a wafer having a device formation area and an inspection pattern formation area, an interconnection layer is formed in the device formation area with forming no interconnection layer in the inspection pattern formation area. An interlayer insulating film is formed to cover the whole surface, and then, is selectively removed to form a first hole exposing a portion of the interconnection layer in the device formation area and a second hole exposing a portion of a silicon layer in the inspection pattern formation area. An aluminum-based alloy is filed into the first and second holes. In the second hole, spiking occurs into the silicon layer when aluminum from the aluminum-based alloy comes in contact with the silicon layer. After filling, the surface above the second hole is observed for an indication that spiking occurred into the silicon layer. A failure to observe spiking indicates an interconnection defect within the first hole in the device formation area.

16 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more specifically to a semiconductor device manufacturing method for making it possible to easily and quickly detect a filling-defective of an aluminum-based alloy filled in a hole immediately after the aluminum based alloy has been filled into the hole under a high temperature process.

2. Description of Related Art

With an advanced microfabrication of semiconductor devices, the size of a through hole connecting between an upper level interconnection and a lower level interconnection is becoming increasingly smaller. The upper level interconnection and the lower level interconnection are ordinarily formed of an aluminum-based alloy (Al-based alloy) by a sputtering process. If the aspect ratio (hole depth/hole diameter) of the hole size exceeds about 0.8 as the result of the advanced fine patterning (down-sizing of the hole diameter), the step coverage of the Al-based alloy in the hole lowers, so that a connection defect often occurs. As a result, reliability of the interconnection deteriorates, or conduction defects occur, with the result that reliability of the semiconductor device becomes a problem. In order to overcome this problem, it has been proposed to deposit Ti (titanium) or TiN (titanium nitride) having a step coverage better than that of the Al-based alloy, before the Al-based alloy is filled into the hole, for the purpose of ensuring an electrical connection. However, this method results in an increased number of process steps.

Now, some filling-up processes for improving the step coverage of the Al-based alloy filled into a fine hole in order to overcome the above mentioned problem, will be described with reference to the drawings. First, a high temperature Al-sputtering, which is one of these processes, will be described with reference to FIGS. 1A to 1C.

Figure 1A:
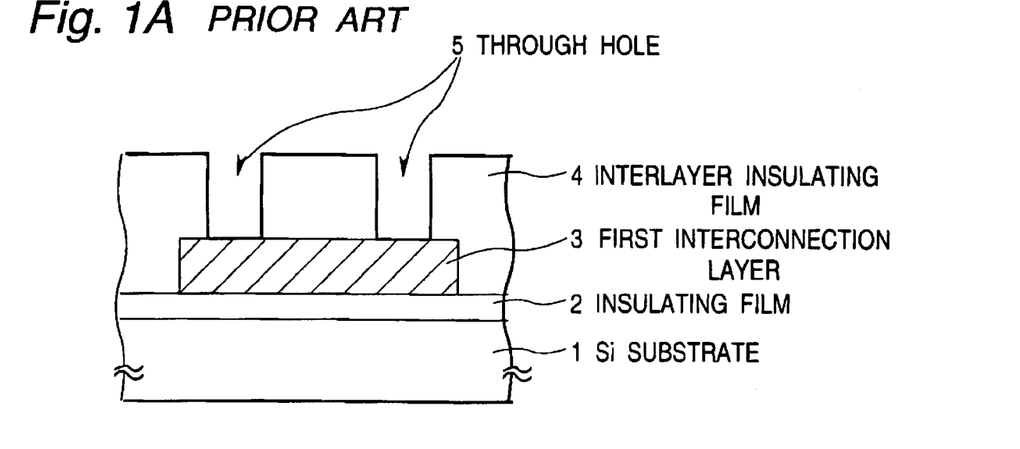
FIGS. 1A to 1C are diagrammatic sectional views for illustrating the high temperature Al-sputtering for filing the through holes.
Figure 1B:
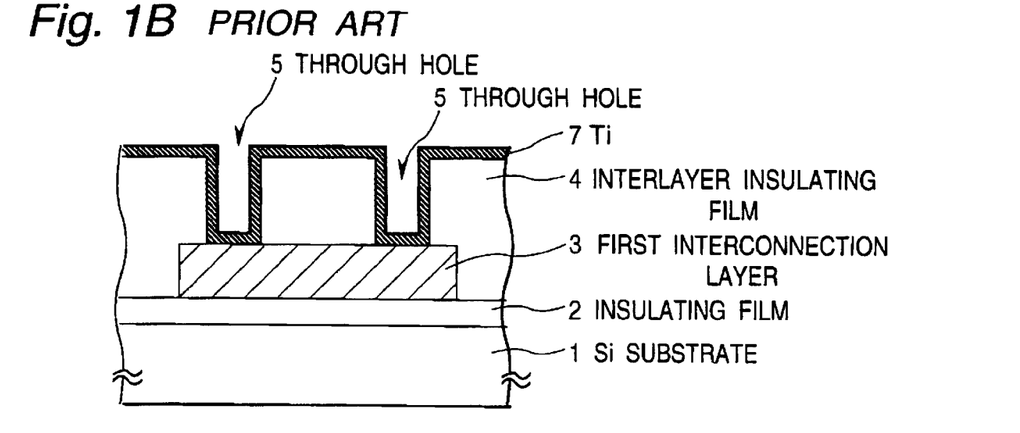
Figure 1C:
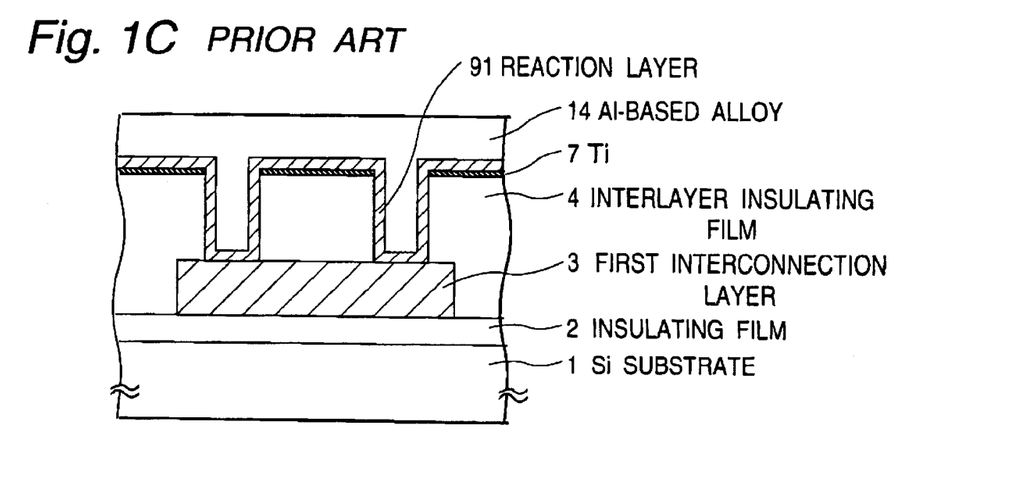

As shown in FIG. 1A, a first interconnection layer 3 is formed and patterned on an insulating film 2 formed on a silicon substrate 1, and an interlayer insulating film 4 is formed on the first interconnection layer 3 and the insulating film 2 by means of a CVD (chemical vapor deposition) process. Then, through holes 5 are formed in the interlayer insulating film 4 to reach the first interconnection layer 3 by a lithography and a dry etching. After a Ti (titanium) film 7 having a good reactivity to an Al-based alloy is uniformly formed on the interlayer insulating film 4 and in the through holes 5 as shown in FIG. 1B, an Al-based alloy layer 14 is deposited in the same vacuum atmosphere by sputtering the Al-based alloy at a low temperature of not greater than 150° C. by a thickness corresponding to about one third to a half of a desired thickness, and then by sputtering the Al-based alloy at a high temperature of 400° C. to 500° C. by the remaining thickness of the desired thickness, thereby to completely fill the through holes 5 with an Al-based alloy layer 14 as shown in FIG. 1C. In this process, Ti and the Al-based alloy react with each other to form a reaction layer 91 on an inner wall surface of the through hole.

Figure 2:
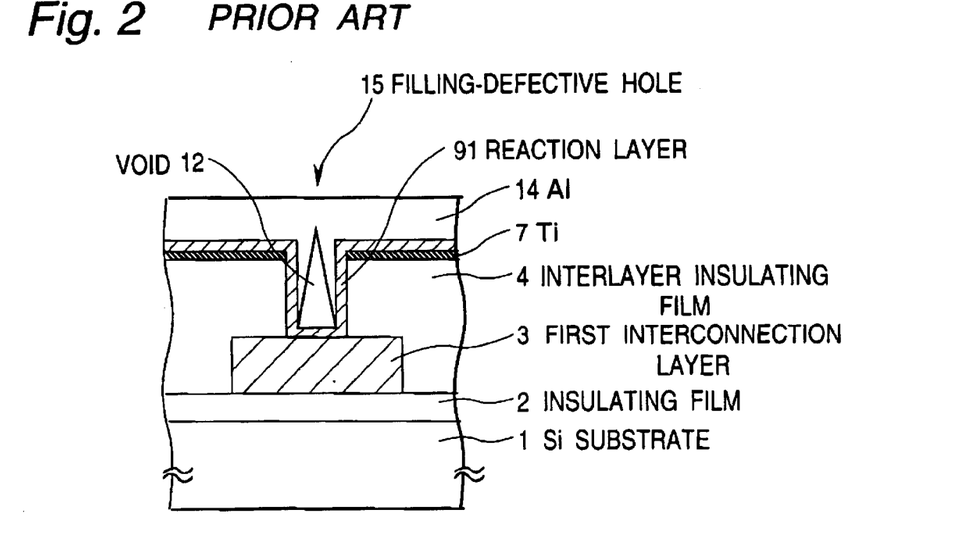
FIG. 2 is a diagrammatic sectional view for illustrating a filling-defective hole having a void within the through hole.

However, in the case of filling the through hole 5 with the Al-based alloy 14 by the high temperature sputtering, a filling-defective hole 15 having a void 12 within the through hole as shown in FIG. 2 often occurs. This filling-defective is generated if the flowability of the Al-based alloy 14 lowers because of deterioration of the degree of vacuum and a drop of a heater temperature in a deposition machine, the Al-based alloy grows to have an overhang in the contact hole, so that a mouth or an upper port of the hole is closed by the overhang, with the result that an upper portion of the hole is closed at an initial stage of the filling-up process.

If the filling-defective hole 15 occurs, the reliability of the interconnection drops, similar to the drop of the step coverage of the Al-based alloy in the hole. Therefore, generation of the void in the hole must be avoided. In addition, if the filling-defective occurred, it is important to detect the existence of the filling-defective.

However, the existence of the filling-defective cannot be found out even if the upper portion of the hole is observed, because the upper portion of the hole is plugged or covered with the Al-based alloy 14 as shown in FIG. 2. In the prior art, therefore, it was necessary to cleave a reference wafer (which is different from a wafer on which products are actually produced) immediately after the filling-up process is completed in the reference wafer, and to observe a plane of cleavage by a SEM (scanning electron microscope) in order to find out the filling-defective. But, various problems were encountered in this method. For example, it is difficult to observe many holes, and it is actually impossible to cleave a product chip after the filling-up process is completed. In addition, it is difficult to accurately compare the reference wafer to the actual product wafer, and the cost increases.

In order to avoid the above mentioned problems, Japanese Patent Application Pre-examination Publication No. JP-A-06-069307 has proposed a non-destructive method for detecting the filling-defective of the Al-based alloy in actual products. Now, this method will be described with reference to FIGS. 3A and 3B.

Figure 3A:
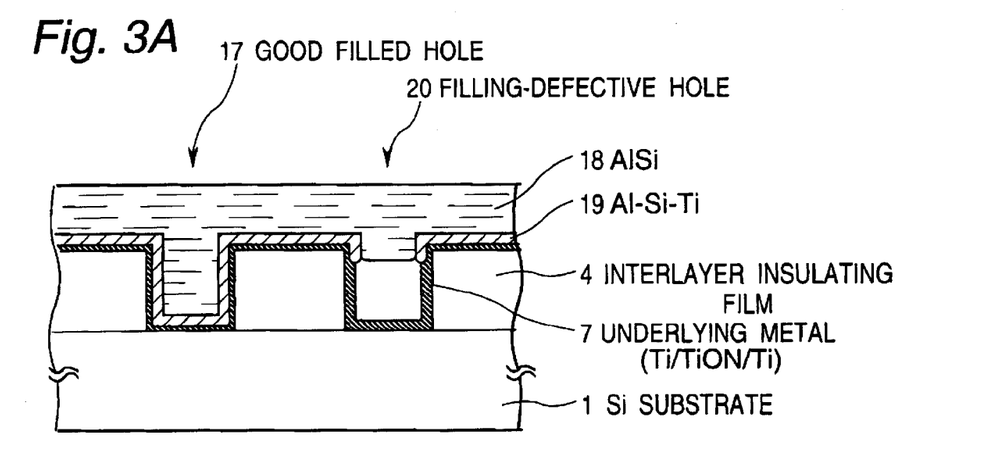
FIGS. 3A and 3B are diagrammatic sectional views for illustrating a defective detecting and observing pattern formed together with the patterns of products on a wafer in the prior art, for detecting a defect of the Al-based alloy filled into the contact hole.
Figure 3B:
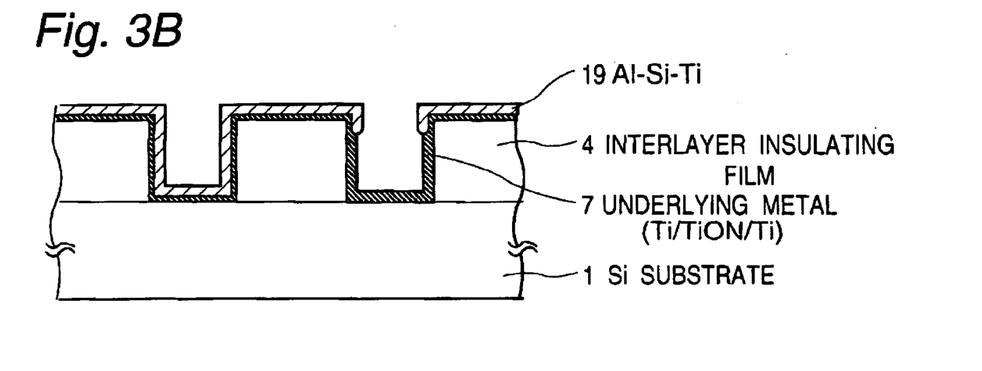

FIGS. 3A and 3B illustrate a defective detecting and observing pattern which is formed together with the patterns of products on a wafer and which is used for detecting a defect of the Al-based alloy filled into the contact hole. An underlying metal layer 7 is formed to cover a surface of an interlayer insulating film 4 formed on a silicon substrate 1 and bottom and side surfaces of through holes formed to penetrate through the interlayer insulating film 4. This underlying metal layer 7 is formed to have a triple layer structure of Ti/TiON/Ti, in order to prevent aluminum from spearing into the substrate.

Specifically, FIG. 3A illustrates the defective detecting and observing pattern after the Al-based alloy (AlSi: aluminum silicide) is filled into the hole. In a good filled hole 17, an AlSi film 18 and an Al—Si—Ti film 19 (which is a reaction product of AlSi and Ti of the uppermost layer of the underlying metal layer 7) is formed in the hole and as a lowermost layer of an interconnection layer. On the other hand, in a filling-defective hole 20, no reaction product 19 is generated, and therefore, a non-reacted Ti remains in the uppermost layer of the underlying metal layer 7.

On the other hand, after the product is completed, the defective detecting and observing pattern is exposed by a lithography, and only the Al-based alloy 18 is removed by a wet etching, as shown in FIG. 3B. After the Al-based alloy 18 is removed, the defective detecting and observing pattern is observed by the SEM or other means. The Al—Si—Ti remaining in the good filled hole 17 has a large concavo-convex surface, and on the other hand, the non-reacted Ti remaining in the filling-defective hole 20 has a smooth surface. This difference in surface condition can be discriminated from a surface morphology.

According to the above mentioned method, it is possible to non-destructively detect whether or not the filling-defective exists in the product.

However, the above mentioned method requires the steps of exposing only the defective detecting and observing pattern by the lithography and of etching the Al-based alloy, in order to detect the filling-defective. As a result, the number of process steps is disadvantageously increased, and therefore, the manufacturing cost is correspondingly increased.

In addition, since a considerable time elapses until the detection of the filling-defective is performed, even if the filling-defective is found out, there is possibility that the filling-defective has occurred in products for which the Al filling has been completed until the detection of the filling-defective is performed. Namely, a damage to the products is magnified. This is because it is not possible to detect the filling-defective immediately after the Al filling is completed.

SUMMARY OF THE INVENTION

Accordingly, it is an object of the present invention to provide a semiconductor device manufacturing method which has overcome the above mentioned shortcomings of the conventional methods.

Another object of the present invention is to provide a semiconductor device manufacturing method that makes it possible to easily and quickly detect a filling-defective immediately after completion of a hole filling process.

The above and other objects of the present invention are achieved in accordance with the present invention by a method for manufacturing a semiconductor device in a wafer having a device formation area and an inspection pattern formation area, the method comprising the steps of forming an interconnection layer in the device formation area while forming no interconnection layer in the inspection pattern formation area, forming an interlayer insulating film to cover the whole surface, selectively removing the interlayer insulating film to form a first hole exposing a portion of the interconnection layer in the device formation area and a second hole exposing a portion of a silicon layer in the inspection pattern formation area, and filling an aluminum-based alloy into the first and second holes.

With the above method, if the aluminum-based alloy is non-defectively filled into the second hole formed in the inspection pattern formation area, the silicon of the silicon layer and the aluminum mutually diffuse in the second hole, so that a so-called spike phenomenon occurs. As a result, an upper surface of an aluminum-based alloy layer portion above the second hole is not planarized, and aluminum disappears within the second hole or a recess is formed in the second hole which should have been completely filled with the aluminum-based alloy. On the other hand, if the filling-defective (void) occurs, since aluminum does not flow into the inside of the second hole, no mutual diffusion between the aluminum and the silicon occurs, with the result that the aluminum-based alloy layer portion above the second hole has a planar upper surface. Therefore, by observing the surface above the second hole by use of an SEM or another means, it is possible to non-destructively detect the filling-defective of the first hole in the device formation area immediately after the filling-up process of the aluminum-based alloy, such as a high temperature sputtering, is completed.

In a preferred embodiment of the semiconductor device manufacturing method in accordance with the present invention, the first hole is formed as a first hole group composed of a plurality of first holes, and the second hole is formed as a second hole group composed of a plurality of second holes. The size of the first holes in the first hole group is substantially the same as that of the second holes in the second hole group, and the spacing between the first holes in the first hole group is substantially the same as that between the second holes in the second hole group.

The above and other objects, features and advantages of the present invention will be apparent from the following description of preferred embodiments of the invention with reference to the accompanying drawings.

DESCRIPTION OF THE PREFERRED EMBODIMENTS

Now, an embodiment of the semiconductor device manufacturing method in accordance with the present invention will be described with reference to FIGS. 4A to 4F. In FIGS. 4A to 4F, a left half shows an inspection pattern formation area, and a right half shows an actual pattern formation area, namely, a device formation area.

Figure 4A:
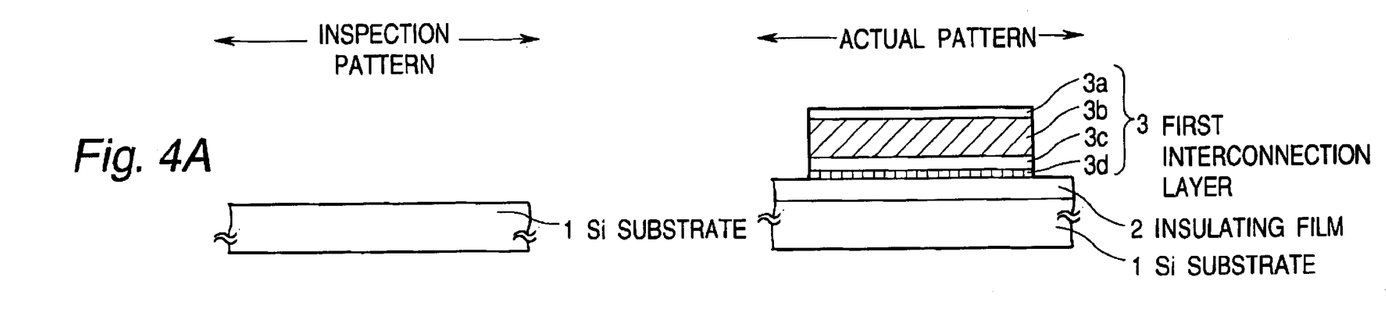
FIGS. 4A to 4F are diagrammatic sectional views for illustrating an embodiment of the semiconductor device manufacturing method in accordance with the present invention, for making it possible to easily and quickly detect a filling-defective immediately after completion of a high temperature sputtering.

First, a first interconnection layer 3 is formed on a single crystalline silicon substrate (wafer) 1 in the inspection pattern formation area and on an insulating film 2 formed on the silicon substrate 1 in the actual pattern formation area. Here, the insulating film 2 is mainly formed of SiO2, but may contain phosphorus or boron, or may be formed of a multi-layer structure of these materials. The first interconnection layer 3 comprises a multi-layer structure composed of an Al-based alloy and a barrier metal, including a reflection preventing film. For example, the multi-layer structure composed of TiN 3*a*/Al-based alloy 3*b*/TiN 3*c*/Ti 3*d*, is formed on the substrate by a sputtering to have a total thickness of about 500 nm to 800 nm, and then, is patterned to form a patterned first interconnection layer 3 in the actual pattern formation area, and on the other hand, to be removed from the inspection pattern formation area so that the silicon substrate 1 is exposed in the inspection pattern formation area, as shown in FIG. 4A.

Figure 4B:
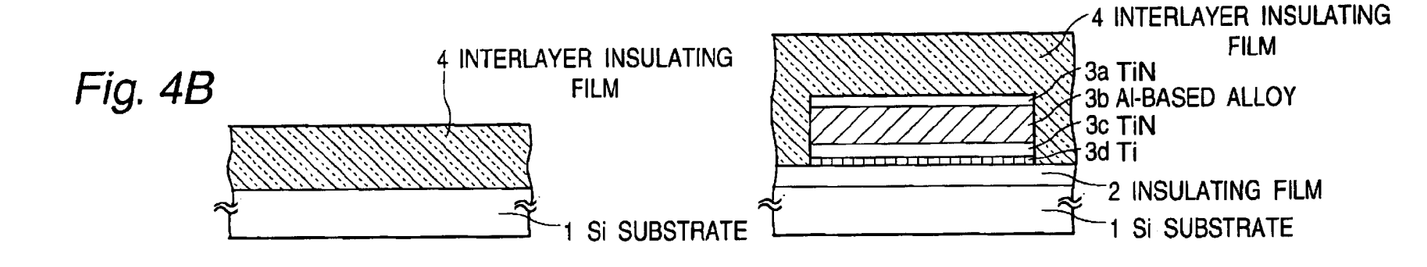

Succeedingly, as shown in FIG. 4B, an interlayer insulating film 4 is deposited by a CVD process to cover the patterned first interconnection layer 3 and the silicon substrate 1 in the actual pattern formation area, and to cover the silicon substrate 1 in the inspection pattern formation area.

This interlayer insulating film 4 is planarized by a spin coating or by a chemical mechanical polishing.

Figure 4C:
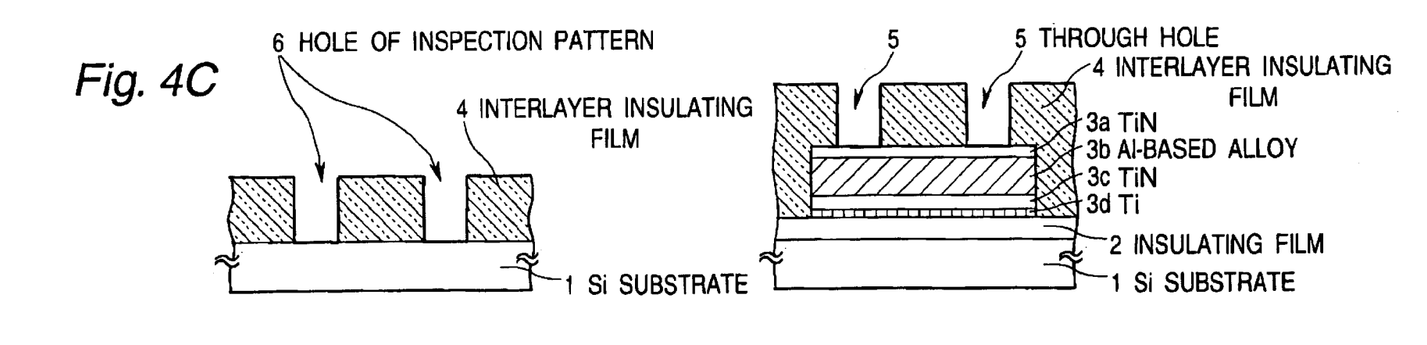
Figure 6:
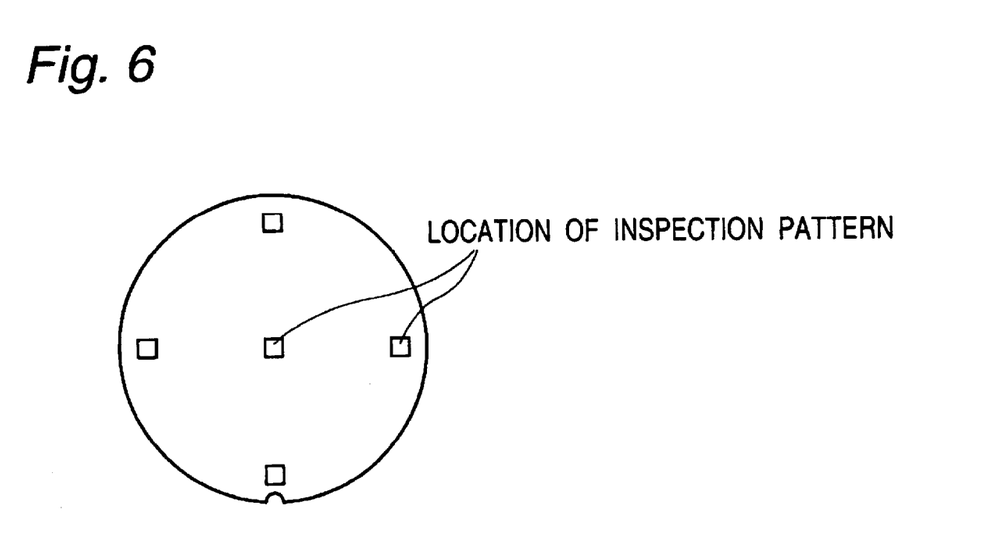
FIG. 6 is a diagrammatic plan view of a wafer for illustrating the location of the inspection pattern.

Thereafter, by a lithography and a dry etching, through holes 5 are formed in the interlayer insulating film 4 in the actual pattern formation area, and simultaneously, inspection holes 6 having the same size as that of the through holes 5 in the actual pattern formation area, are formed in the interlayer insulating film 4 in the inspection pattern formation area, as shown in FIG. 4C. In this connection, the inspection pattern formation area is provided in more than one location within one wafer. For example, as shown in FIG. 6, the inspection pattern formation area is provided at a center position and at four peripheral positions which are located at equal angles. In addition, in each inspection pattern formation area, a plurality of inspection holes are formed, as shown in FIG. 4C. These inspection holes formed in each inspection pattern formation area have the same size as that of the through holes formed in the actual pattern formation area, and furthermore, are separated from each other with the same spacing as that between the through holes formed in the actual pattern formation area. In particular, the inspection hole pattern to be formed in the inspection pattern formation area are preferably made similar to that which is selected from various through hole patterns to be formed in the actual pattern formation area and in which the filling-defective is liable to occur.

Figure 4D:
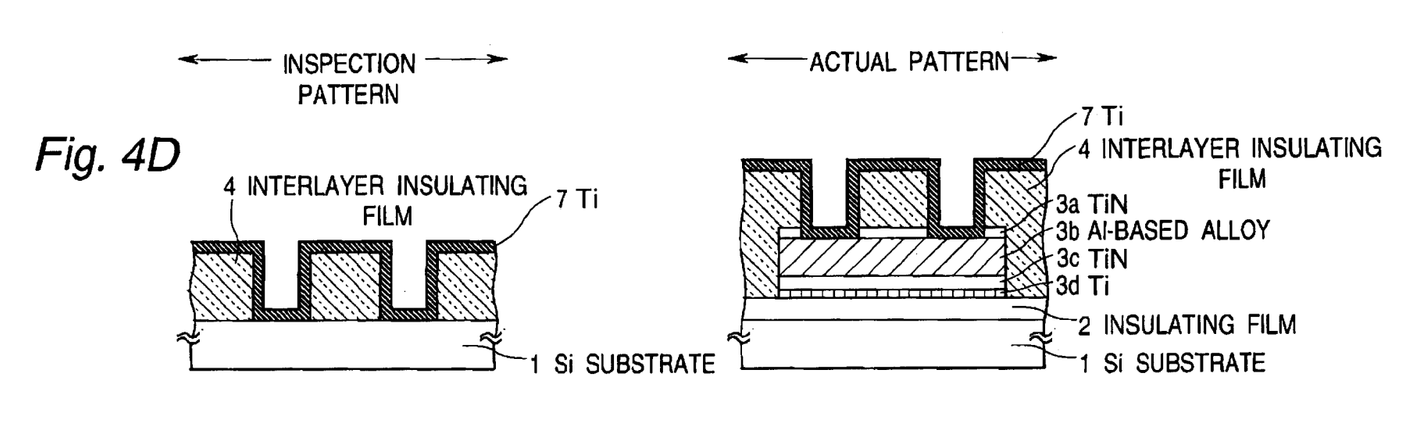

Then, as an underlying metal for improving wettability of aluminum, a titanium layer 7 is deposited in both the areas by a sputtering, as shown in FIG. 4D. Here, this titanium sputtering is controlled to the effect that the titanium layer 7 deposited on the bottom of the inspection hole 6 has the thickness (on the order of about 20 nm to 50 nm) ensuring that all of the titanium layer 7 deposited on the bottom of the inspection hole 6 reacts with an Al-based alloy which will be sputtered in a first step of a two-step aluminum filling process.

Figure 4E:
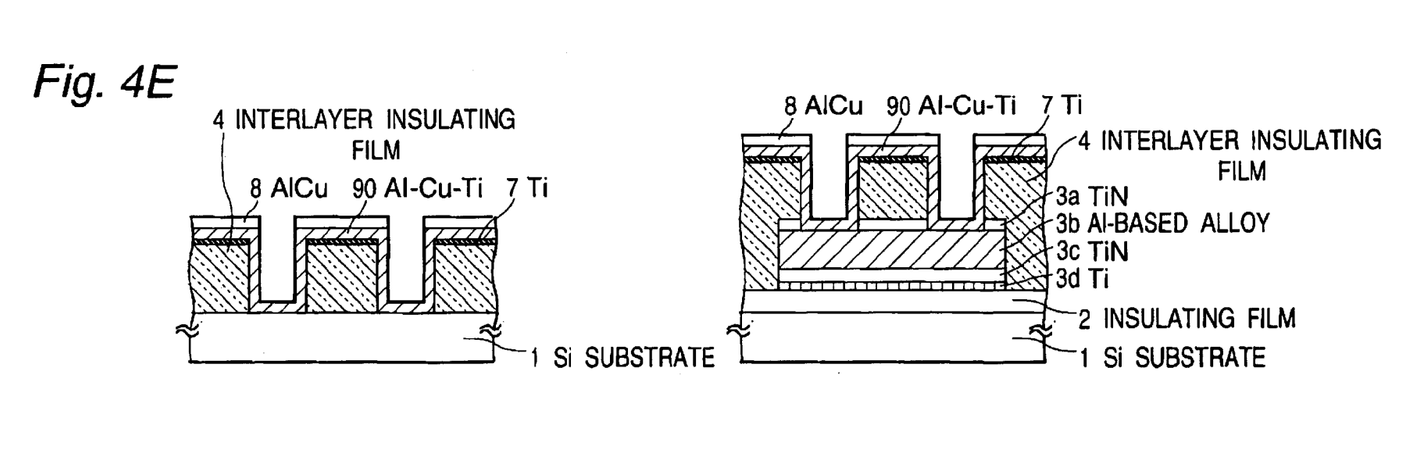

Thereafter, in the same vacuum atmosphere, as shown in FIG. 4E, an AlCu 8 (as the Al-based alloy) is deposited by a sputtering in both the areas at a temperature (wafer temperature of not greater than about 300° C. ) where aluminum never aggregates, to have a thickness (on the order of about 200 nm to 400 nm) ensuring that all of the titanium layer 7 deposited on the bottom of the inspection hole 6 reacts with AlCu to form an alloy 90 of Al—Cu—Ti. At this time, the rate of the sputtering is on the order of about 1000 nm/min. Since the titanium layer 7 deposited on the interlayer insulating film 4 has the thickness slightly larger than that of the titanium layer 7 deposited-in the inspection hole, the titanium layer 7, which does not become the alloy layer 90, remains on the interlayer insulating film 4. The shapes of the holes formed in both the areas are the same at this step, as shown in FIG. 4E. Succeedingly, in the same vacuum atmosphere, AlCu 8 corresponding to the remaining thickness of a desired thickness (about 600nm to 800nm) of the Al-based alloy layer, is deposited in both the areas by a sputtering at a temperature (wafer temperature in the range of about 400° C. to 450° C.) where the Al-based alloy has high flowability, and at a sputtering rate as low as about 100 nm/min to 200 nm/min.

Figure 4F:
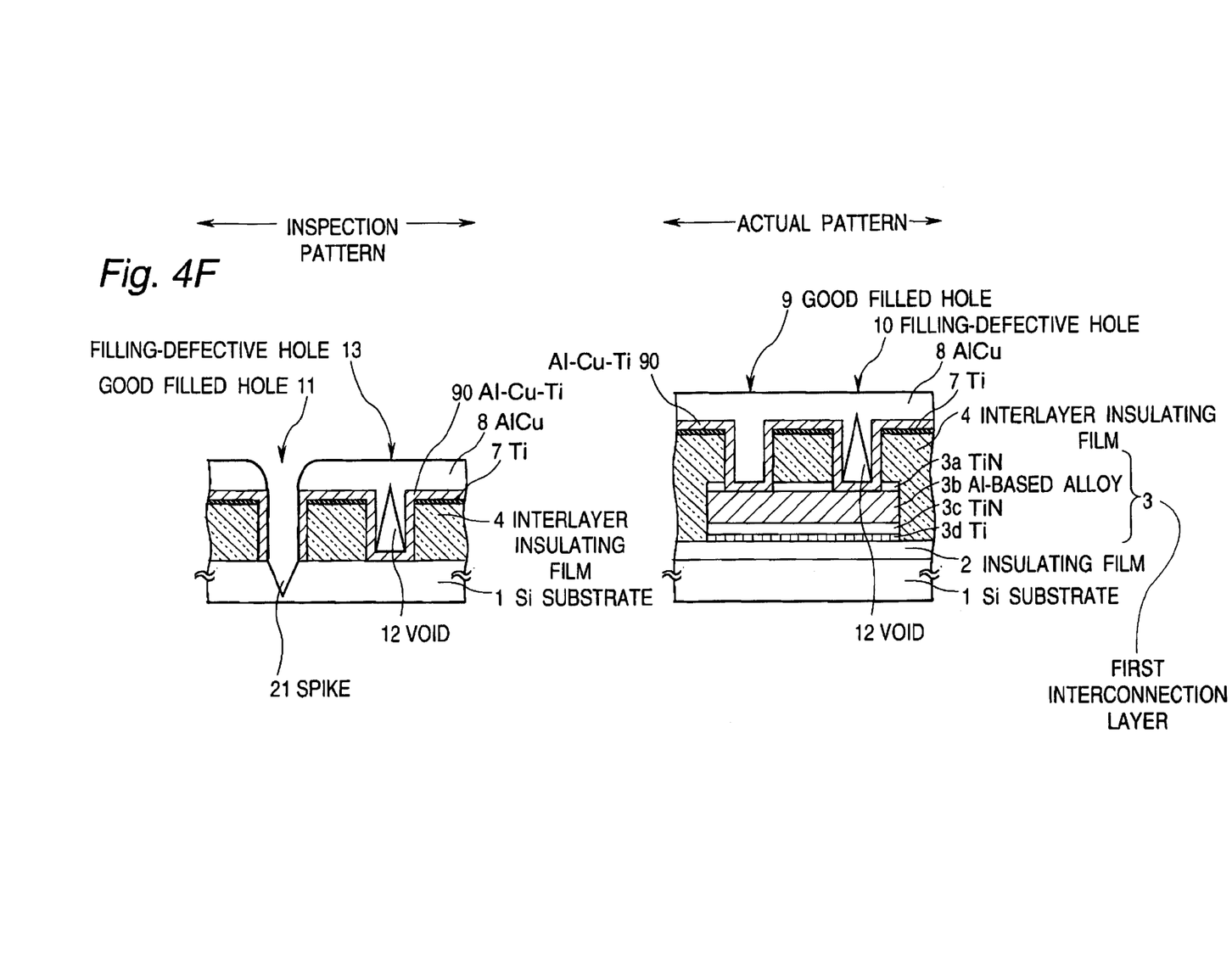

In this process, in the actual pattern formation area, if AlCu 8 flows into the through hole before the upper port or mouth of the through hole is closed by AlCu 8, AlCu 8 is deposited within the through hole 5 to completely fill up the through hole 5. As a result, a good filled hole 9 is formed as shown in FIG. 4F. On the other hand, if the upper port or mouth of the through hole is closed by AlCu 8 before AlCu 8 sufficiently flows into the hole, a filling-defective hole 10 having a void 12 is formed, also shown in FIG. 4F. Since the surface of the AlCu layer 8 is planar not only above the filling-defective hole 10 having the void 12 but also above the good filled hole 9 having no void, it is impossible to detect the filling-defective by an observation from top.

On the other hand, in the inspection pattern formation area, if AlCu 8 flows into the hole before the upper port or mouth of the inspection hole is closed by AlCu 8, namely, when the good filled hole 9 is formed the actual pattern formation area, the AlCu 8 flowed down to the bottom of the inspection hole reacts with the underlying Al—Cu—Ti alloy 90 and further with the silicon substrate 1 under the Al—Cu—Ti alloy 90.

Figure 5:
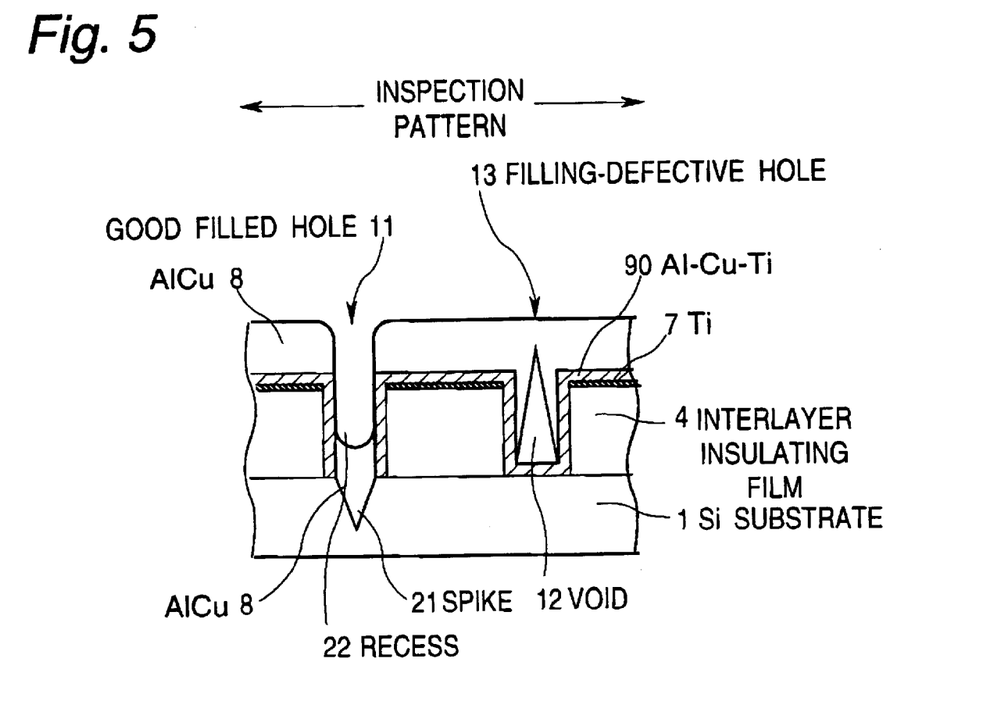
FIG. 5 is a diagrammatic sectional view for illustrating a recess formed in the hole in the embodiment of the semiconductor device manufacturing method in accordance with the present invention.

In this reaction process, the AlCu 8 diffuses into the silicon substrate 1, to form a spike 21 spearing into the silicon substrate 1. Because of formation of the spike 21, the amount of the AlCu 8 flowed into the inspection hole reduces. As a result, when AlCu 8 deposited on the interlayer insulating film reaches the predetermined desired thickness, the AlCu 8 flowed into the inspection hole disappears in the good filled hole 11 of the inspection pattern formation area, as shown in FIG. 4F. Alternatively, as shown in FIG. 5, a recess 22 is formed in or on the good filled hole 11.

However, if the upper port or mouth of the hole is closed by AlCu 8 before AlCu 8 sufficiently flows into the inspection hole, namely, when the filling-defective hole 10 is formed in the actual pattern formation area, AlCu 8 does not react with Al—Cu—Ti and silicon because the AlCu 8 does not flow down to the bottom of the hole. As a result, the upper surface of the AlCu layer 8 above the inspection hole is planar, however, a filling-defective inspection hole 13 having a void 12 is formed.

By observing the upper surface of the inspection pattern formation area thus formed, from top, by means of the SEM or another means, it can be discriminated that, if the recess is found out at the position of the inspection hole, the hole filling is good, and on the other hand, if the surface is planar, the hole filling is defective. Thus, it is possible to easily and quickly detect a filling-defective immediately after completion of a hole filling step.

In the above mentioned embodiment, in order to facilitate deposition of the Al-based alloy onto an inner wall of the hole and to excellently fill the hole with the Al-based alloy, the deposition of the Al-based alloy for the hole filling is carried out by two steps, namely, a step of a low temperature (where aluminum never aggregates) and a step of a high temperature (where the Al-based alloy layer has high flowability). These two steps may be carried out in different deposition chambers, respectively, or alternatively, may be carried out in the same deposition chamber. In any case, a similar effect can be obtained. In the case that the two steps are carried out in the same deposition chamber, for example, the deposition at the temperature of not greater than 300° C. can be realized by setting a heat stage at a point bringing the wafer temperature to 400° C. to 450° C., but by supplying no gas to a rear surface of the wafer. At this time, the sputtering rate is set on the order of 1000 nm/min. Thereafter, by supplying a gas to the rear surface of the wafer, the sputtering is carried out at the wafer temperature of 400° C. to 450° C. In this case, the sputtering rate is set on the order of 100 nm/min to 200 nm/min.

Incidentally, in the above mentioned embodiment, the Al-based alloy filling is carried by a high temperature sputtering. However, it would be a matter of course to persons skilled in the art that, the Al-based alloy filling can be carried by another means capable of causing the Al-based alloy to flow, for example, a reflow.

In the above mentioned embodiment, in addition, AlCu is used as the Al-based alloy. However, the Al-based alloy is in no way limited to only AlCu, and the Al-based alloy can be contain another element such as Si or Ge. Furthermore, the lower level interconnection is basically formed of the Al-based alloy, but can be formed of another interconnection material, for example, a refractory metal such as tungsten (W).

Moreover, the holes of the inspection pattern are formed on the silicon substrate, but the invention is not limited to only this example. For example, the holes of the inspection pattern can be formed on a polysilicon layer of a memory capacitor.

As mentioned above, according to the semiconductor device manufacturing method in accordance with the present invention, the inspection pattern having the same pattern as the actual pattern is formed on a silicon region in or on a product wafer (in which actual products are formed). With this arrangement, it is possible to easily, quickly and non-destructively detect the defective of an Al-based conducting material filling immediately after completion of the step of filling a hole with the Al-based conducting material by a process capable of causing the Al-based conducting material to flow, for example, the high temperature sputtering. Therefore, a reference wafer is no longer necessary. In addition, it is possible to prevent the defective products from being increased until the filling-defective is found out. Therefore, the manufacturing cost can be remarkably reduced. Furthermore, since the inspect pattern of inspection holes is the same as the actual pattern of the actual through holes, the precision of the detection of the filling-defective can be improved.

The invention has thus been shown and described with reference to the specific embodiments. However, it should be noted that the present invention is in no way limited to the details of the illustrated structures but changes and modifications may be made within the scope of the appended claims.

What is claim is:

1. A method for manufacturing a semiconductor device in a wafer having a device formation area and an inspection pattern formation area, the method comprising the steps of:
   forming an interconnection layer in said device formation area and forming no interconnection layer in said inspection pattern formation area;
   forming an interlayer insulating film to cover the device formation area and the inspection pattern area;
   selectively removing said interlayer insulating film to form (1) a first hole exposing a portion of said interconnection layer in said device formation area and (2) a second hole exposing a portion of a silicon layer in said inspection pattern formation area;
   filling said first and second holes with an aluminum-based alloy;
   reacting the aluminum-based alloy at the bottom of said second hole with the silicon layer, comprising:
      diffusing the aluminum-based alloy with the silicon layer, wherein aluminum of the aluminum-based alloy and silicon of the silicon layer mutually diffuse,
      forming a spike-like indentation in the silicon layer at the bottom of said second hole, as the aluminum and the silicon mutually diffuse, and forming a recess in a surface above said second hole; and
   verifying that said recess exists in the surface above said second hole, after said reacting step,
   wherein verified formation of said recess in the surface above said second hole indicates that said first hole in the device formation area does not contain a filling defect, and
   wherein an absence of said recess above said second hole indicates a filling defect within said first hole in said device formation area.

2. A method claimed in claim 1, wherein said wafer includes a plurality of inspection pattern formation areas located at different locations across said wafer.

3. A method claimed in claim 1, wherein said interconnection layer is formed of a conducting material selected form the group consisting of an aluminum-based alloy and tungsten.

4. A method claimed in claim 1, wherein said silicon layer is constituted of either a single crystalline silicon substrate which is said wafer itself, or a polysilicon layer formed on said wafer.

5. A method claimed in claim 1, wherein said first hole is formed as a first hole group composed of a plurality of first holes, and said second hole are formed as a second hole group composed of a plurality of second holes, and wherein the size of said first holes in said first hole group is substantially the same as that of said second holes in said second hole group, and the spacing between said first holes in said first hole group is substantially the same as that between said second holes in said second hole group.

6. A method claimed in claim 5, wherein said wafer includes a plurality of inspection pattern formation areas located at different locations including a center of said wafer.

7. A method claimed in claim 5, wherein said interconnection layer is formed of a conducting material selected from the group consisting of an aluminum-based alloy and tungsten.

8. A method claimed in claim 5, wherein said silicon layer is constituted of either a single crystalline silicon substrate which is said wafer itself, or a polysilicon layer formed on said wafer.

9. A method claimed in claim 1, further comprising a step of forming a wettability layer after said step forming the interlayer insulating film and before said step filling the holes with the aluminum-based alloy, wherein the aluminum-based alloy intermixes with the wettability layer at the bottom of the second hole.

10. A method claimed in claim 9, wherein the wettability layer comprises titanium.

11. A method for manufacturing a semiconductor device in a wafer having a device formation area and an inspection pattern formation area, the method comprising the steps of:
    forming an interconnection layer in said device formation area and forming no interconnection layer in said inspection pattern formation area;
    forming an interlayer insulating film to cover the device formation area and the inspection pattern area;
    selectively removing said interlayer insulating film to form (1) a first hole exposing a portion of said interconnection layer in said device formation area and (2) a second hole exposing a portion of a silicon layer in said inspection pattern formation area;
    forming a wettability layer after said step forming the interlayer insulating film and before said step depositing the aluminum-based alloy layer, wherein the aluminum-based alloy layer intermixes with the wettability layer at the bottom of the second hole, whereby the interface forms between the silicon layer and the aluminum from the aluminum-based alloy layer;
    depositing an aluminum-based alloy layer into said first and second holes, wherein a spike-like indentation forms in the silicon layer at the bottom of said second hole at an interface of the silicon layer and aluminum from the aluminum-based alloy layer; and observing surface planarity of said aluminum-based alloy layer above said second hole in said inspection pattern formation area, wherein a planar surface above said second hole indicates an absence of said spike-like indentation within said second hole and a filling defect within said first hole in said device formation area.

12. A method claimed in claim 11, wherein the wettability layer comprises titanium.

13. A method claimed in claim 11, wherein said first hole is formed as a first hole group composed of a plurality of first holes, and said second hole are formed as a second hole group composed of a plurality of second holes, and wherein the size of said first holes in said first hole group is substantially the same as that of said second holes in said second hole group, and the spacing between said first holes in said first hole group is substantially the same as that between said second holes in said second hole group.

14. A method claimed in claim 13, wherein said wafer includes a plurality of inspection pattern formation areas located at different locations across said wafer.

15. A method claimed in claim 13, wherein said interconnection layer is formed of a conducting material selected from the group consisting of an aluminum-based alloy and tungsten.

16. A method claimed in claim 13, wherein said silicon layer is constituted of either a single crystalline silicon substrate which is said wafer itself, or a polysilicon layer formed on said wafer.

* * * * *